United States Patent
Conway et al.

(10) Patent No.: US 10,056,919 B2
(45) Date of Patent: Aug. 21, 2018

(54) DATA RECOVERY UTILIZING OPTIMIZED CODE TABLE SIGNALING

(71) Applicant: AgilePQ, INC., San Diego, CA (US)

(72) Inventors: Bruce Conway, Williston, ND (US); Louis E. Halperin, Omaha, NE (US)

(73) Assignee: AgilePQ, Inc., San Diego, CA (US)

(*) Notice: Subject to any disclaimer, the term of this patent is extended or adjusted under 35 U.S.C. 154(b) by 0 days.

(21) Appl. No.: 15/322,700

(22) PCT Filed: Jul. 1, 2015

(86) PCT No.: PCT/US2015/038802
§ 371 (c)(1),
(2) Date: Dec. 28, 2016

(87) PCT Pub. No.: WO2016/004185
PCT Pub. Date: Jan. 7, 2016

(65) Prior Publication Data
US 2017/0163284 A1   Jun. 8, 2017

Related U.S. Application Data

(60) Provisional application No. 62/020,294, filed on Jul. 2, 2014.

(51) Int. Cl.
| | |
|---|---|
| H03M 7/00 | (2006.01) |
| H03M 7/30 | (2006.01) |
| H03M 7/42 | (2006.01) |
| H03M 7/40 | (2006.01) |
| H03M 7/50 | (2006.01) |

(52) U.S. Cl.
CPC .......... *H03M 7/6058* (2013.01); *H03M 7/42* (2013.01); *H03M 7/30* (2013.01); *H03M 7/40* (2013.01); *H03M 7/50* (2013.01)

(58) Field of Classification Search
CPC . H03M 7/30; H03M 7/40; H04N 7/50; H04N 7/26755; H04N 7/26106
USPC ....... 341/106, 67, 65, 51; 382/233, 246, 234
See application file for complete search history.

(56) References Cited

U.S. PATENT DOCUMENTS

| | | |
|---|---|---|
| 723,188 A | 3/1903 | Tesla |
| 725,605 A | 4/1903 | Tesla |
| 3,296,532 A | 1/1967 | Robinson |
| 3,305,781 A | 2/1967 | Robinson |

(Continued)

FOREIGN PATENT DOCUMENTS

| | | |
|---|---|---|
| EP | 1 521 414 A1 | 4/2005 |
| WO | WO-00/11845 A1 | 3/2000 |

(Continued)

OTHER PUBLICATIONS

U.S. Appl. No. 14/243,438, filed Apr. 2, 2014.

(Continued)

*Primary Examiner* — Joseph Lauture
(74) *Attorney, Agent, or Firm* — Foley & Lardner LLP

(57) ABSTRACT

A computer-implemented method, system, and apparatus for storing binary data is disclosed. A processor receives a digital bit stream and transforms the digital bit stream to an encoded digital bit stream. The encoded digital bit stream comprises a data message encoded by an OCTS-expanded table for storage. The processor stores the encoded digital bit stream on a digital data storage device or system.

25 Claims, 11 Drawing Sheets

(56) References Cited

U.S. PATENT DOCUMENTS

| | | |
|---|---|---|
| 3,350,646 A | 10/1967 | Graziano et al. |
| 3,699,450 A | 10/1972 | Rainal |
| 3,917,935 A | 11/1975 | Lazecki |
| 4,030,067 A | 6/1977 | Howell et al. |
| 4,494,238 A | 1/1985 | Groth, Jr. |
| 4,528,550 A | 7/1985 | Graves et al. |
| 4,623,999 A | 11/1986 | Patterson |
| 4,628,517 A | 12/1986 | Schwarz et al. |
| 4,630,288 A | 12/1986 | Longstaff et al. |
| 4,649,541 A | 3/1987 | Lahmeyer |
| 4,694,455 A | 9/1987 | Koga |
| 4,731,799 A | 3/1988 | Longstaff et al. |
| 4,733,401 A | 3/1988 | Longstaff |
| 4,747,103 A | 5/1988 | Iwamura et al. |
| 4,849,975 A | 7/1989 | Patel |
| 4,933,956 A | 6/1990 | Forney, Jr. |
| 4,958,349 A | 9/1990 | Tanner et al. |
| 5,150,381 A | 9/1992 | Forney et al. |
| 5,331,320 A | 7/1994 | Cideciyan et al. |
| 5,548,819 A | 8/1996 | Robb |
| 5,577,087 A | 11/1996 | Furuya |
| 5,612,651 A | 3/1997 | Chethik |
| 5,799,088 A | 8/1998 | Raike |
| 5,931,966 A | 8/1999 | Carley |
| 5,970,097 A | 10/1999 | Ishikawa et al. |
| 6,085,340 A | 7/2000 | Postol |
| 6,223,320 B1 | 4/2001 | Dubey et al. |
| 6,247,159 B1 | 6/2001 | Shih et al. |
| 6,553,535 B1 | 4/2003 | Asada et al. |
| 6,571,368 B1 | 5/2003 | Chen |
| 6,771,824 B1 * | 8/2004 | Chiu .................... H03M 7/42 375/E7.144 |
| 6,788,696 B2 | 9/2004 | Allan et al. |
| 6,925,126 B2 | 8/2005 | Lan et al. |
| 7,095,707 B2 | 8/2006 | Rakib et al. |
| 7,106,228 B2 | 9/2006 | Bessette et al. |
| 7,197,094 B2 | 3/2007 | Tung |
| 7,197,689 B2 | 3/2007 | Hekstra et al. |
| 7,277,507 B2 | 10/2007 | Takagi |
| 7,295,624 B2 | 11/2007 | Onggosanusi et al. |
| 7,301,983 B1 | 11/2007 | Horne |
| 7,376,105 B2 | 5/2008 | Asada et al. |
| 7,400,689 B2 | 7/2008 | Matsumoto et al. |
| 7,571,316 B2 | 8/2009 | Onno et al. |
| 7,680,670 B2 | 3/2010 | Lamblin et al. |
| 7,970,215 B2 | 6/2011 | Haque et al. |
| 7,990,891 B2 | 8/2011 | Lu et al. |
| 8,005,460 B2 | 8/2011 | Chen et al. |
| 8,077,534 B2 | 12/2011 | Arsovski et al. |
| 8,149,810 B1 | 4/2012 | Narasimhan et al. |
| 8,194,558 B2 | 6/2012 | Choi et al. |
| 8,219,737 B2 | 7/2012 | Rofougaran |
| 8,254,484 B2 | 8/2012 | Kim et al. |
| 8,307,184 B1 | 11/2012 | Nissani (Nissensohn) et al. |
| 8,320,473 B1 | 11/2012 | Conway |
| 8,473,812 B2 | 6/2013 | Ramamoorthy et al. |
| 8,503,559 B2 | 8/2013 | Au-Yeung et al. |
| 8,539,318 B2 | 9/2013 | Cronie et al. |
| 8,571,223 B2 | 10/2013 | Du et al. |
| 8,634,450 B2 | 1/2014 | Vidal et al. |
| 8,677,215 B2 | 3/2014 | Ramamoorthy et al. |
| 8,718,170 B2 | 5/2014 | Nissani (Nissensohn) et al. |
| 8,829,984 B2 | 9/2014 | Batruni |
| 8,831,159 B2 | 9/2014 | Itkin |
| 8,855,028 B2 | 10/2014 | Kim |
| 8,955,069 B1 | 2/2015 | Dotan et al. |
| 8,984,609 B1 | 3/2015 | Juels et al. |
| 9,031,156 B2 | 5/2015 | Conway |
| 9,118,661 B1 | 8/2015 | Juels et al. |
| 9,203,556 B2 | 12/2015 | Conway |
| 9,225,171 B2 | 12/2015 | Chen et al. |
| 9,225,717 B1 | 12/2015 | Brainard et al. |
| 9,270,655 B1 | 2/2016 | Juels et al. |
| 9,350,545 B1 | 5/2016 | Triandopoulos et al. |
| 9,407,631 B1 | 8/2016 | Triandopoulos et al. |
| 9,432,360 B1 | 8/2016 | Triandopoulos et al. |
| 9,444,580 B2 | 9/2016 | Conway |
| 9,454,654 B1 | 9/2016 | Triandopoulos et al. |
| 9,455,799 B2 | 9/2016 | Conway |
| 9,515,989 B1 | 12/2016 | Juels et al. |
| 9,698,940 B2 | 7/2017 | Conway |
| 2001/0048683 A1 | 12/2001 | Allan et al. |
| 2002/0191712 A1 | 12/2002 | Gaddam et al. |
| 2003/0137438 A1 | 7/2003 | Yokose |
| 2004/0088640 A1 | 5/2004 | Lin et al. |
| 2004/0179685 A1 | 9/2004 | Soliman |
| 2004/0203456 A1 | 10/2004 | Onggosanusi et al. |
| 2006/0056538 A1 | 3/2006 | Nam et al. |
| 2006/0170571 A1 | 8/2006 | Martinian et al. |
| 2006/0248337 A1 | 11/2006 | Koodli |
| 2007/0162236 A1 | 7/2007 | Lamblin et al. |
| 2007/0201632 A1 | 8/2007 | Ionescu |
| 2008/0071847 A1 | 3/2008 | Cho et al. |
| 2009/0285126 A1 | 11/2009 | Lu et al. |
| 2010/0309793 A1 | 12/2010 | Choi et al. |
| 2011/0302478 A1 | 12/2011 | Cronie et al. |
| 2012/0059968 A1 | 3/2012 | Rofougaran |
| 2012/0201337 A1 | 8/2012 | Itkin |
| 2013/0003808 A1 | 1/2013 | Au-Yeung et al. |
| 2013/0282940 A1 | 10/2013 | Depta |
| 2015/0043344 A1 | 2/2015 | Conway |
| 2015/0043621 A1 | 2/2015 | Conway |
| 2015/0043668 A1 | 2/2015 | Conway |
| 2015/0195060 A1 | 7/2015 | Conway |
| 2015/0349921 A1 | 12/2015 | Conway |
| 2016/0254877 A1 | 9/2016 | Conway |
| 2016/0380648 A1 | 12/2016 | Conway |

FOREIGN PATENT DOCUMENTS

| | | |
|---|---|---|
| WO | WO-2004/098067 A1 | 11/2004 |
| WO | WO-2006/049419 A1 | 5/2006 |
| WO | WO-2007/035148 A2 | 3/2007 |
| WO | WO-2009/132601 A1 | 11/2009 |
| WO | WO-2015/020737 A1 | 2/2015 |
| WO | WO-2016/004185 A1 | 1/2016 |

OTHER PUBLICATIONS

U.S. Appl. No. 14/705,626, filed May 6, 2015.

U.S. Appl. No. 14/863,075, filed Sep. 23, 2015.

U.S. Appl. No. 15/262,966, filed Sep. 12, 2016.

Anonymous, "Lookup table," Wikipedia, the free encyclopedia, Jun. 11, 2014 (pp. 1-5); Retrieved from the Internet: URL:http://web.archive.org/web/20140621081859/http//en.wikipedia.org/wiki/Lookip_table [retrieved on Jul. 9, 2015].

Anonymous, "Lookup Table," Wikipedia, retrieved from http://web.archive.org/web/20140621081859/http://en.wikipedia.org/wiki/Lookup_table, Feb. 28, 2016, 5 pages.

Agrawal, Shweta et al., "On the Secrecy Rate of Interference Networks Using Structured Codes," University of Texas, Austin, May 13, 2009.

Belfiore, Jean-Claude, et al., "Secrecy Gain: a Wiretap Lattice Code Design," Department of Communications and Electronics, TELECOM ParisTech, Paris, France, Jul. 8, 2010.

Boutros, Joseph, et al., "Good Lattice Constellations for Both Rayleigh Fading and Gaussian Channels," IEEE Transactions on Information Theory, vol. 42, No. 2, Mar. 1996 (pp. 502-518).

Brennan, Linear Diversity Combining Techniques, Proc. of the IRE, pp. 1075-1102 (Jun. 1959).

Conway, John H., et al., "A Fast Encoding Method for Lattice Codes and Quantizers," IEEE Transactions on Information Theory, vol. IT-29, No. 6, Nov. 1983 (pp. 820-824).

Cooper, et al., Modern Communications and Spread Spectrum, McGraw-Hill, pp. 268-411 (1986).

Currie, R., Developments in Car Hacking, SANS Institute, InfoSec Reading Room, Accepted Dec. 5, 2015 (33 pages).

Forney, D. David Jr., "Coset Codes—Part I: Introduction and Geometrical Classification." IEEE Transactions on Information Theory, vol. 34, No. 5, Sep. 1988 (pp. 1123-1151).

(56) References Cited

OTHER PUBLICATIONS

Goeckel, Dennis L., "Adaptive Coding for Time-Varying Channels Using Outdated Fading Estimates," IEEE Transactions on Communications, vol. 47, No. 6, Jun. 1999 (pp. 844-855).
Goldsmith, Andrea J., "Adaptive Coded Modulation for Fading Channels," IEEE Transactions on Communications, vol. 46, No. 5, May 1998 (pp. 595-602).
Goldsmith, Andrea, "Wireless Communications," Stanford University, Copyright 2005 by Cambridge University Press.
He, Xiang, et al., "Providing Secrecy with Lattice Codes," Forty-Sixth Annual Allerton Conference, Allerton House, UIUC, Illinois, USA, Sep. 23-26, 2008 (pp. 1199-1206).
He, Xiang, et al., "Providing Secrecy With Structure Codes: Tools and Applications to Two-User Gaussian Channels," Jul. 30, 2009.
Inglis, Electronic Communications Handbook, McGraw-Hill, pp. 22, 1-22, 19 (1988).
Khandani, A. K., et al., "Shaping of Multi-dimensional Signal Constellations Using a Lookup Table," Proc. IEEE Int. Conf. Commun. (Chicago, IL), Jun. 1992 (pp. 927-931).
Kim, Taejoon, et al., "Differential Rotation Feedback MIMO System for Temporally Correlated Channels," Global Telecommunications Conference, 2008. IEEE Globecom 2008. IEEE, Nov. 30, 2008-Dec. 4, 2008.
Kurkoski, Brian M., "The E8 Lattice and Error Correction in Multi-Level Flash Memory," University of Electro-Communications, Tokyo, Japan, Feb. 16, 2011.
Lang, Gordon R., et al., "A Leech Lattice Modem," IEEE Journal on Selected Areas in Communications, vol. 7, No. 6, Aug. 1989 (pp. 968-973).
Ling, Cong, et al., "Semantically Secure Lattice Codes for the Gaussian Wiretap Channel," IEEE Transactions on Information Theory, vol. 60, No. 10, Oct. 2014 (pp. 6399-6416).
Mansour, Mohamed F., "Efficient Huffman Decoding with Table Lookup," Acoustics, Speech and Signal Processing, 2007. ICASSP 2007. IEEE International Conference (downloaded Apr. 6, 2016).
Mondal, Bishwarup, et al., "Channel Adaptive Quantization for Limited Feedback MIMO Beamforming Systems," IEEE Transactions on Signal Processing, vol. 54, No. 12, Dec. 2006 (p. 4717-4729).
Oggier, Frederique et al., "Lattice Codes for the Wiretap Gaussian Channel: Construction and Analysis," Jan. 9, 2013.
Ostergaard, Jan et al., "Source-Channel Erasure Codes with Lattice Codebooks for Multiple Description Coding," ISIT 2006, Seattle, USA, Jul. 9-14, 2006.
PCT International Search Report and Written Opinion dated Sep. 15, 2015 in Int'l PCT Patent Application No. PCT/US2015/038802.
Rhee, Duho et al., "Adaptive Modulation and Coding on Multipath Rayleigh Fading Channels Based on Channel Prediction," Advanced Communication Technology, 2006. ICACT 2006. The 8th International Conference, vol. 1, Feb. 20-22, 2006 (pp. 195-199).
Rohde, et al., Communications Receivers, McGraw-Hill, pp. 462-471 (1988).
Schilling, et al., Spread Spectrum Goes Commercial, IEEE Spectrum, pp. 40-45 (Aug. 1990).
Tiuri, Radio Astronomy Receivers, IEEE Trans. Antennas and Propagation AP-12(7), pp. 930-938 (Dec. 1964).
University of Wyoming, Department of Mathematics, Fall 2005, Bitstreams & Digital Dreams "Error-Correcting Codes," (downloaded Apr. 6, 2016).
Viterbo, Emanuele et al., "Algebraic Number Theory and Code Design for Rayleigh Fading Channels," Publishers Inc., 2004 (pp. 5-18, 21-26, 63-71).
Viterbo, Emanuele, "Tecniche matematiche computazionali per l'analisi ed it progetto di costellazioni a reticolo," Feb. 23, 1995.
Viterbo, Emanuele, et al. "A Universal Lattice Code Decoder for Fading Channels," IEEE Transactions on Information Theory, vol. 45, No. 5, Jul. 1999 (pp. 1639-1642).
Alkim, et al., Post-quantum key exchange—a new hope, 2015(32 pages).
International Search Report & Written Opinion dated Aug. 9, 2017 in Int'l PCT Patent Appl Serial No. PCT/US2017/036002.

\* cited by examiner ary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

DATA RECOVERY UTILIZING OPTIMIZED CODE TABLE SIGNALING

CROSS-REFERENCES TO RELATED APPLICATIONS

This application is a U.S. national stage filing under 35 U.S.C. § 371 of International Patent Application No. PCT/US2015/038802, filed Jul. 1, 2015, which claims the benefit of U.S. Provisional Patent Application Ser. No. 62/020,294, titled DATA RECOVERY UTILIZING OPTIMIZED CODE TABLE SIGNALING, filed Jul. 2, 2014, the entire contents of each of which are incorporated herein by reference.

This application is related to International Application No. PCT/US2014/044661, titled OPTIMIZED CODE TABLE SIGNALING, filed Jun. 27, 2014, and published as Publication No. WO 2015/020737, which is herein incorporated by reference in its entirety.

TECHNICAL FIELD

The disclosure generally relates to the field of data storage devices and systems, particularly to data storage system utilizing optimized code table signaling (OCTS).

BACKGROUND

Various data storage schemes are available for data storage devices and systems. Partitioning and redundancy techniques (e.g., Block separation, RAID, Mirroring) may be utilized in such data storage schemes. In addition, encoding and decoding processes may also be utilized to improve the security of the data being stored. This disclosure is directed to the application of OCTS to data storage and the ability to characterize the data storage device or system and recover lost data that has been stored in a data storage device or system utilizing OCTS. Data storage systems may include digital data storage and systems and multi-level memory data storage and systems.

SUMMARY

The present disclosure is directed to a data storage method. The method applies OCTS to a digital data stream for the purpose of characterizing the data storage device or system as well as enhancing data recovery due to failures of the data storage device or system; adapting to a data storage device or system; operating independent of industry and regulatory standards for data storage methods.

A further embodiment applies OCTS to a digital data stream for the purpose of characterizing a multi-level memory storage device or system as well as enhancing data recovery due to failures of the multi-level memory storage device or system; adapting to a multi-level memory storage device or system; operating independent of industry and regulatory standards for multi-level memory storage methods.

A further embodiment includes applying OCTS to an analog bit stream that has been digitized for the purpose of data storage; adapting to a data storage method selected for storage of digitized analog signals; operating independent of industry and regulatory standards for input digitized analog signal stream and data storage methods.

A further embodiment includes applying OCTS to an analog bit stream that has been digitized for the purpose of multi-level memory storage; adapting to a multi-level memory storage method selected for storage of digitized analog signals; operating independent of industry and regulatory standards for input digitized analog signal stream and multi-level memory storage methods.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The novel features of the embodiments described herein are set forth with particularity in the appended claims. The embodiments, however, both as to organization and methods of operation may be better understood by reference to the following description, taken in conjunction with the accompanying drawings as follows:

DESCRIPTION

Figure 1:
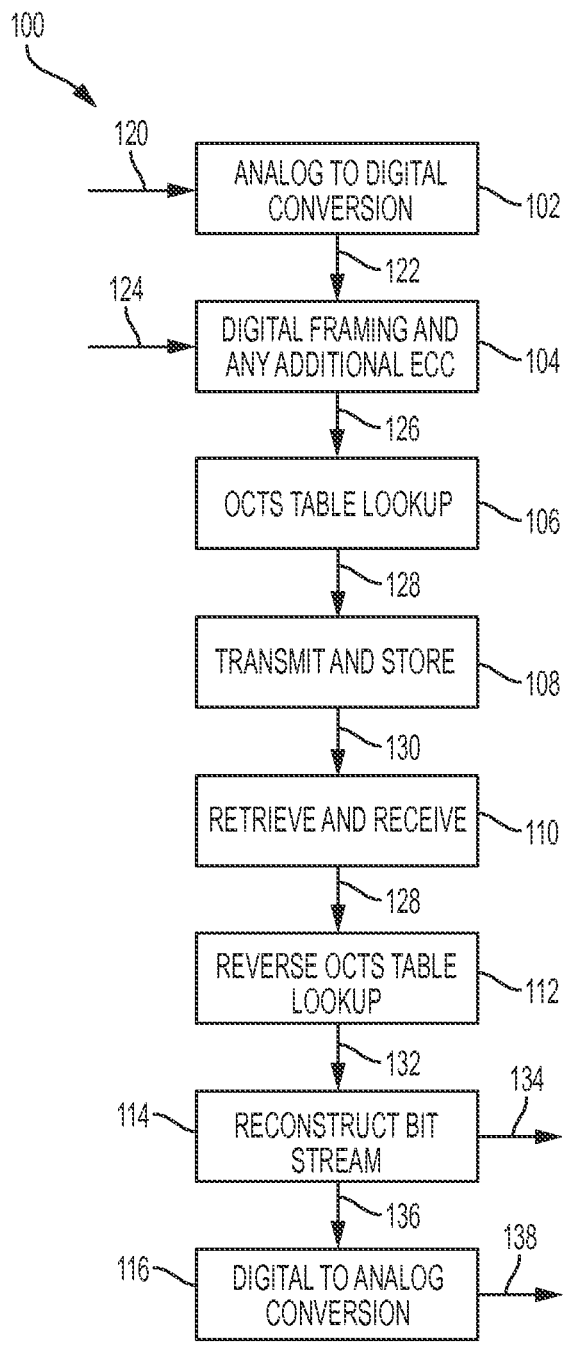
FIG. 1 illustrates one embodiment of the Optimized Code Table Signaling (OCTS) process.

Before explaining the various aspects of OCTS-expanded for data storage in detail, it should be noted that the various aspects disclosed herein are not limited in their application or use to the details of construction and arrangement of parts illustrated in the accompanying drawings and description. Rather, any disclosed aspect of OCTS-expanded for data storage may be positioned or incorporated in other aspects, variations, and modifications thereof, and may be practiced or carried out in various ways. Accordingly, aspects of OCTS-expanded for data storage disclosed herein are illustrative in nature and are not meant to limit the scope or application thereof. Furthermore, unless otherwise indicated, the terms and expressions employed herein have been chosen for the purpose of describing the aspects for the convenience of the reader and are not to limit the scope thereof. In addition, it should be understood that any one or more of the disclosed aspects, expressions of aspects, and/or examples thereof, can be combined with any one or more of the other disclosed aspects, expressions of aspects, and/or examples thereof, without limitation.

In the following description, like reference characters designate like or corresponding parts throughout the several views. Also, in the following description, it is to be understood that terms such as front, back, inside, outside, top, bottom and the like are words of convenience and are not to be construed as limiting terms. Terminology used herein is not meant to be limiting insofar as devices described herein, or portions thereof, may be attached or utilized in other orientations. The various aspects will be described in more detail with reference to the drawings.

1. OCTS Process Flow

FIG. 1 illustrates one embodiment of the Optimized Code Table Signaling (OCTS) process 100. The OCTS process 100 provides encoding of binary inputs to vectors that are presented to the storage controller, and provides the reverse process of converting the stored vector to a binary output vector upon retrieval. By judicious choice of the OCTS table, the parameters of Bit Error Rate ("BER"), hardware error rates, software/firmware error rates, and data transfer rates may be managed dynamically to provide optimized performance. Initial synchronization, table management, regaining synchronization after a signal dropout, and entering a network are managed outside of the basic OCTS process definition. OCTS is described in U.S. Pat. No. 8,320,473, issued on Nov. 27, 2012, and entitled "DATA COMMUNICATION SYSTEM UTILIZING OPTIMIZED CODE TABLE SIGNALING," which is hereby incorporated by reference in its entirety. Extensions to OCTS are described in U.S. patent application Ser. No. 14/062,535, filed on Oct. 24, 2013, entitled "OPTIMIZED DATA TRANSFER UTILIZING OPTIMIZED CODE TABLE SIGNALING," which is hereby incorporated by reference in its entirety.

FIG. 1 illustrates one embodiment of an OCTS information flow 100. An analog input 120 is converted 102 to a digital bit stream 122. Alternatively or additionally, a digital input 124 is provided as a digital bit stream 122. A digital frame and additional error control coding (ECC) 104 is applied to the digital bit stream 122 to produce a binary input vector 126. The binary input vector 126 is provided to an OCTS table lookup 106. The OCTS table lookup 106 produces an output vector 128, which is provided for transmission 108. The output vector 128 may be manipulated in a number of ways, such as for instance modulation, prior to transmission 108. The manipulated and/or un-manipulated signal is transmitted 108 over a carrier 130. The carrier 130 can be any one of a radio frequency channel, a cellular channel, or a wired or wireless transmission medium. Alternatively or additionally, the carrier 130 can be an electronic storage medium. At a destination the manipulated and/or un-manipulated signal is received 110 and optionally re-manipulated to reconstruct the output vector 128. The output vector 128 is provided to a reverse OCTS table lookup 112, which produces a binary output data vector 132. In some embodiments, the binary output data vector 132 is reconstructed 114 to produce a digital output 134. In other embodiments, the output data vector 132 is reconstructed 114 to produce an output bit stream 136, which is presented to a digital to analog conversion 116. The digital to analog conversion 116 produces an analog output 138.

In some embodiments, the output vectors 128 that are the output of the OCTS table lookup 106 and the input to the reverse OCTS table lookup 112 can include the binary vectors in and out of a conventional data storage device or system.

OCTS-expanded for data storage provides management of the initial synchronization, table management, regaining synchronization after a signal dropout, and entering a network. OCTS-expanded for data storage expands the utility of OCTS as an industry-standards agnostic interface to existing data storage devices or systems. In some embodiments, an OCTS-expanded table comprises an additional column in the OCTS table indicating the expanded use of each encoded vector, in addition to internal OCTS-expanded control messages and a data.

Figure 2:
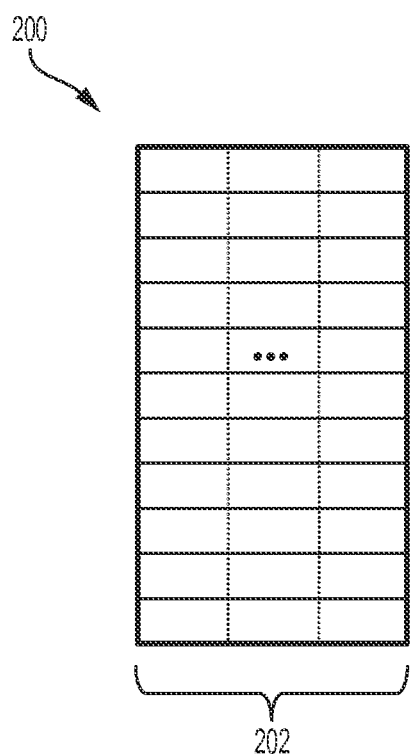
FIG. 2 illustrates one embodiment of a standard OCTS table.
Figure 3:
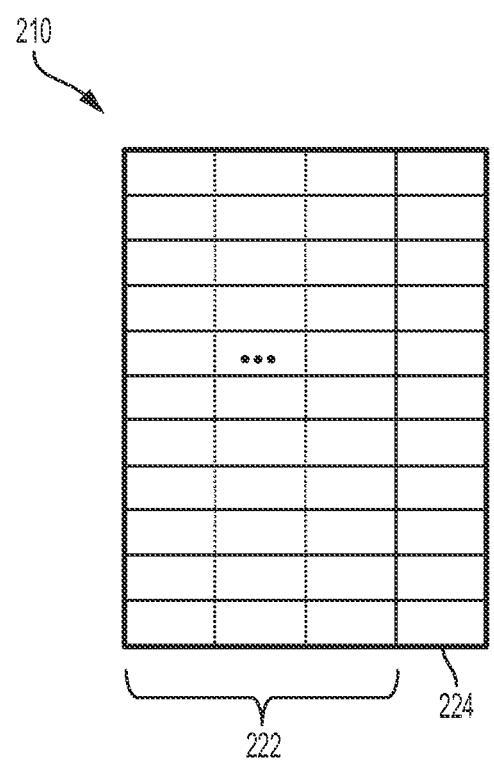
FIG. 3 illustrates one embodiment of an OCTS-expanded table comprising an additional column.

FIG. 2 illustrates one embodiment of a standard OCTS table 200. A standard OCTS table 200 comprises a number of OCTS-encoded vectors 202. FIG. 3 illustrates one embodiment of an OCTS-expanded table 210 comprising an additional column 214. The OCTS-expanded table 210 comprises one or more OCTS encoded vectors 212 and further comprises a use column 214. The use column 214 identifies the use of a vector within the OCTS-expanded table 210.

Figure 4A:
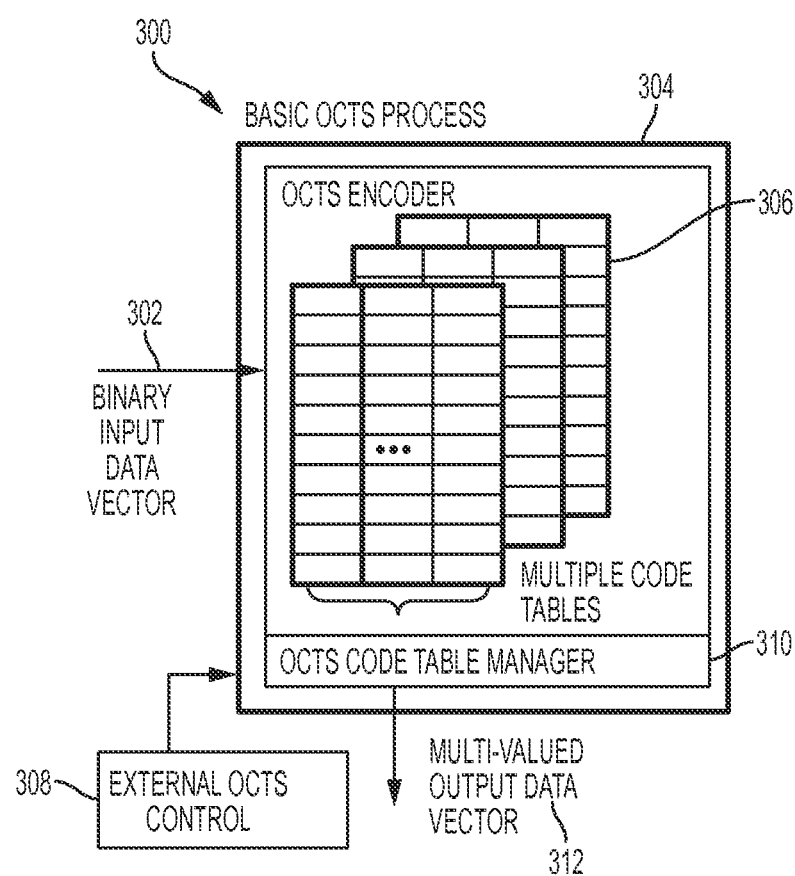
FIG. 4A illustrates one embodiment of a basic OCTS process.

FIG. 4A illustrates one embodiment of a basic OCTS process 300. A binary input data vector 302 is presented to an OCTS encoder 304. The OCTS encoder 304 comprises one or more code tables 306 as illustrated by the standard OCTS table 200 in FIG. 2, and an OCTS code table manager 310. According to FIG. 4A, an external OCTS control 308 directs the OCTS encoder 304. The binary input data vector 312 is encoded by the OCTS encoder 304 into an output data vector 302.

Figure 4B:
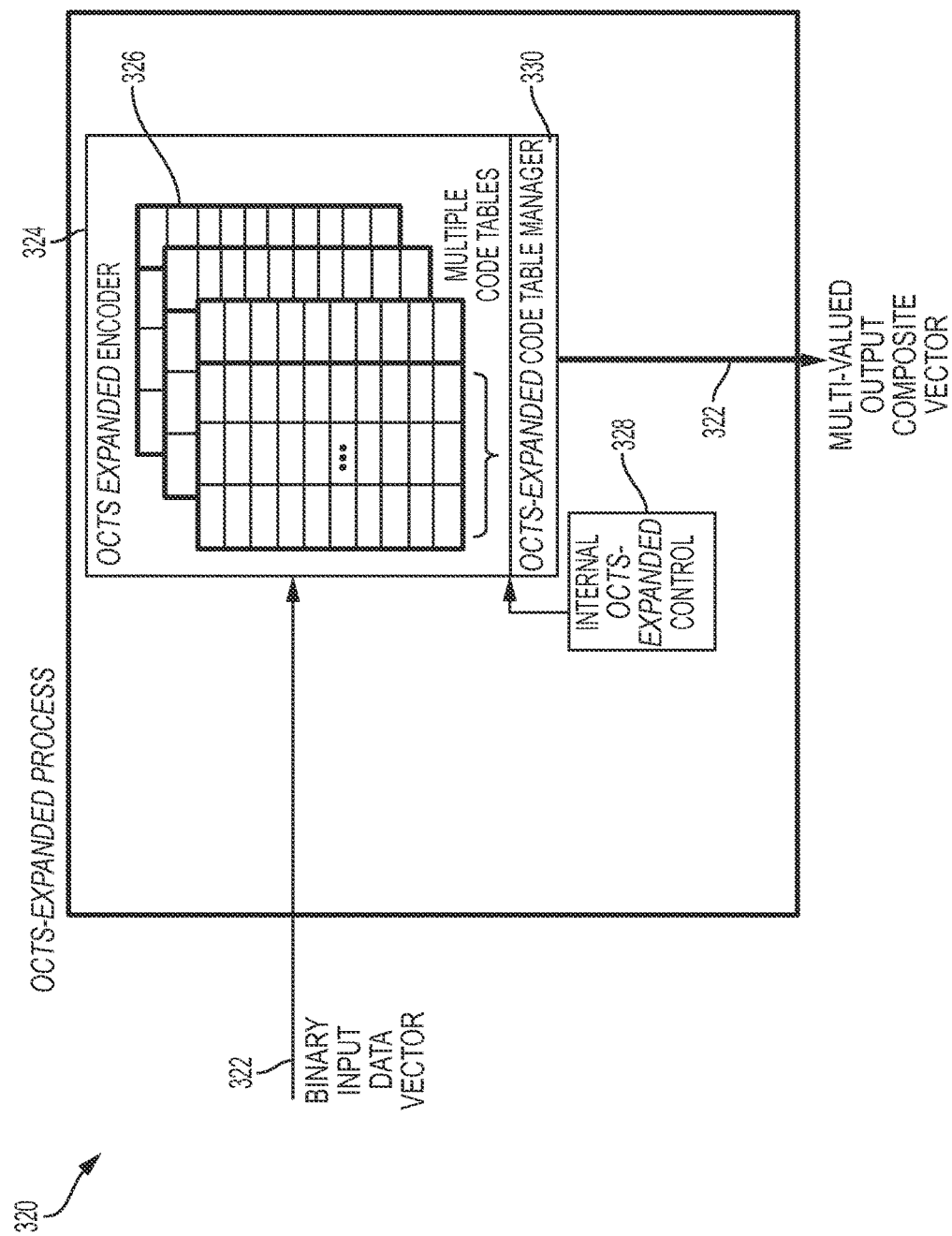
FIG. 4B illustrates one embodiment of an OCTS-expanded process.

FIG. 4B illustrates one embodiment of an OCTS-expanded process 320. A binary input data vector 322 is presented to an OCTS-expanded encoder 324. The OCTS-expanded encoder 324 comprises one or more code tables 326 as illustrated by the OCTS-expanded table 210 in FIG. 3 with an additional use column, and an OCTS-expanded code table manager 330. Returning to FIG. 4B, an internal OCTS-expanded control 328 directs the OCTS-expanded encoder 324. The output of the OCTS-expanded encoder 324 is used to produce an output data vector 332.

2. Data Recovery Utilizing (OCTS)

In various aspects the present disclosure provides various techniques for data recovery employing OCTS. These techniques include, by way of example and without limitation lost data recovery, memory readout efficiency, fractional bit encoding, channel sensing, optimization and control, and multiple secure memory partitions using OCTS tools.

2.1 Lost Data Recovery

In one embodiment, the data recovery process according to the present disclosure provides an application of OCTS table-driven encoding technique to recover at least one missing element of an n-element vector of digital vector by means of encoding at least n+1 digital elements. This is applicable to both binary and non-binary digital encoding. Non-binary refers to coding with more than two states, to include ternary, quaternary, quintenary, etc. The immediate purpose of the lost data recovery process is to recover lost data from memory cells. As opposed to the communications model where information lost to noise can be recovered by requesting a retransmission, there is no opportunity to request a retransmission from a failed memory cell.

Accordingly, the lost data recovery process recovers lost data by creating a code table (e.g., an OCTS table) with additional vector elements such that a stored memory word stored as an n-element real-valued vector can be decoded accurately using n−1 elements. By encoding n elements and decoding using n−1 elements, one additional element can be held in reserve. When an error in memory read out is detected the data can be recovered by reading the reserve element, swapping it sequentially for an original element until the decoded data changes and the checksum function passes. There are a variety of methods for efficiently identifying a memory error. Examples include using a checksum or cyclic redundant code (CRC) function against the read of a set of memory cells, and code tables constructed such that an errant bit can be identified algorithmically.

2.1.a. Data Recovery Process

The data recovery process performs a minimum number of memory reads required to identify and correct an errant bit, to find the errant bit with table lookup functions rather than nearest neighbor searches, and to efficiently characterize the error and take the appropriate corrective action.

Figure 5:
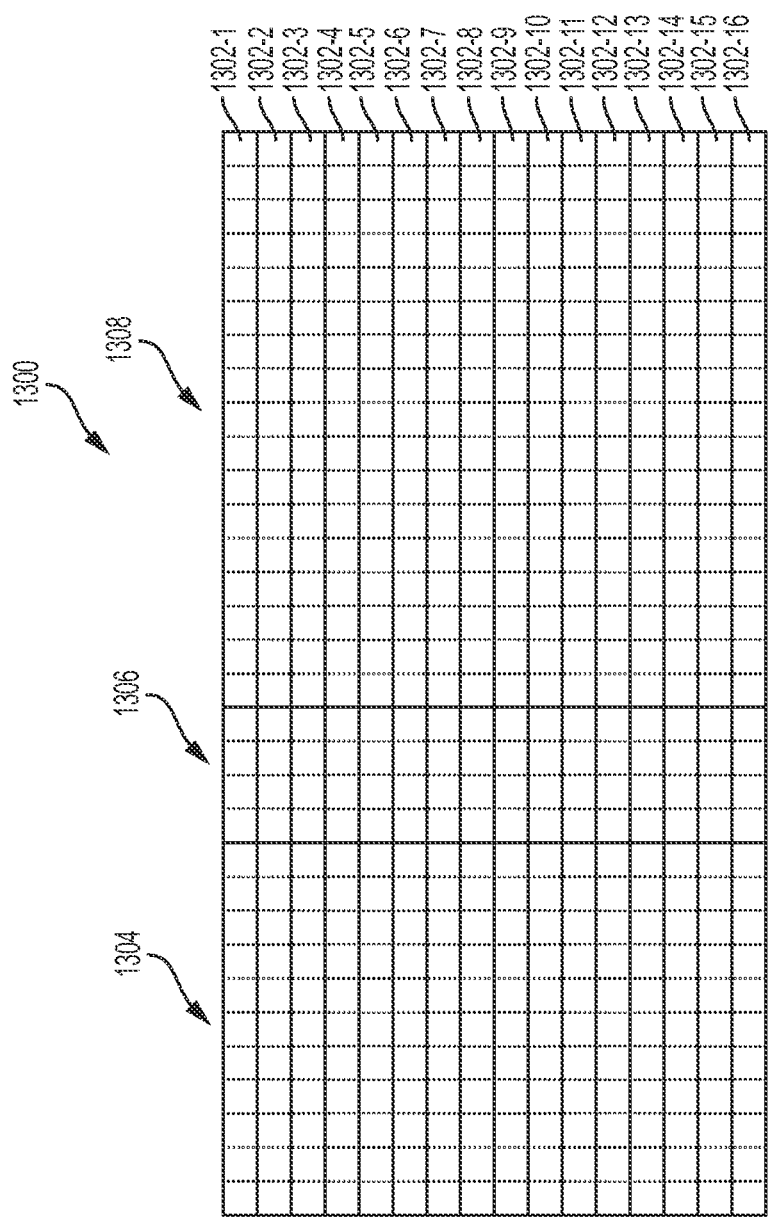
FIG. 5 illustrates one embodiment of a block of data.

FIG. 5 illustrates one embodiment of a block of data 1300. In one embodiment, the data recovery process in accordance with the present disclosure provides a technique for detecting and correcting an error within a block of data 1300. The advantage of a block of data 1300 over a single word of data is that the correctness of the entire block of data 1300 can be validated with a checksum or CRC function across the entire block of data 1300, rather than memory word by memory word. FIG. 5 illustrates a 16 word block 1300 where each word 1302-1 to 1302-16 comprises 11 data bit words 1304 (e.g., 11 data elements), with four reserved bits 1306 (e.g., four reserved elements) saved with each word 1302-1 to 1302-16 and 17 replacement bits 1308 (e.g., replacement elements) available for each word 1302-1 to 1302-16. The entire block 1300 of 16 words 1302-1 to 1302-16 is saved with each write cycle and read with each read cycle.

Figure 6:
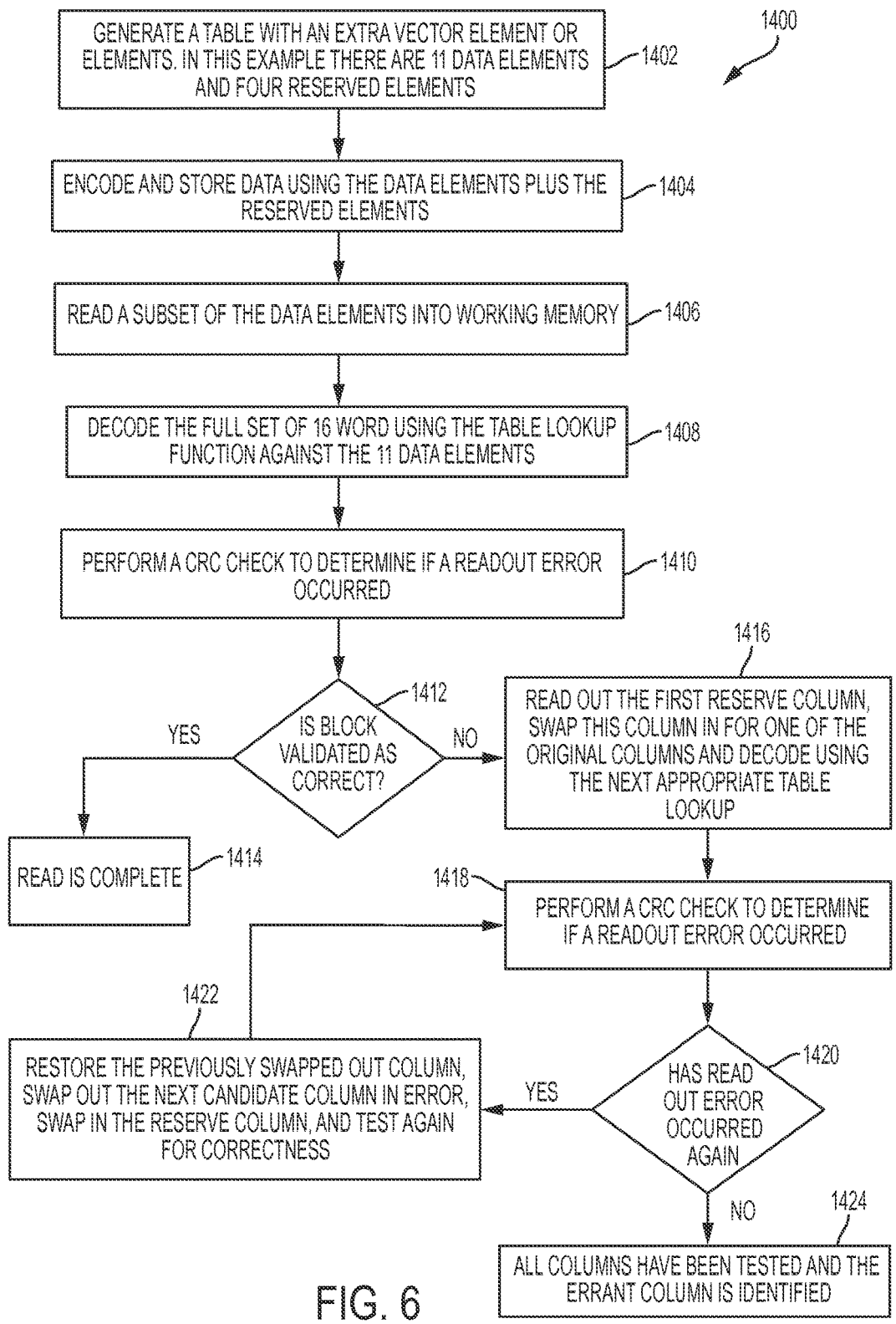
FIG. 6 illustrates one embodiment of a data recovery process.

FIG. 6 illustrates one embodiment of a data recovery process 1400. In accordance with the data recovery process 1400 a table is generated 1402 with an extra vector element or elements. In the example shown in FIG. 5 there are 11 data elements 1304 and four reserved elements 1306. With reference to FIGS. 5 and 6, data is encoded and stored 1404 using the data elements 1304 plus the reserved elements 1306. A subset of the data elements 1304 is read 1406 into working memory. The full set of 16 words is decoded 1408 using the table lookup function against the 11 data elements 1304. A CRC check is performed 1410 to determine if a readout error occurred. If the block is validated 1412 as correct, the read is completed 1414. If a read error has occurred 1412, the first reserve column is read out 1416, the present column is swapped for one of the original columns and is decoded using the next appropriate table lookup. A CRC check is performed 1418 to determine if a read out error has occurred again. If a read out error has occurred 1420, the previously swapped out column is restored 1422, the next candidate column in error is swapped out, the reserve column is swapped in, and tested again for correctness. The process 1400 continues until all columns have been tested and the errant column is identified 1424.

The above process 1400 assumes that there is only a single error. The first strategy for identification of more than one error is to swap columns pairwise and perform a search of candidate columns similar as above. Since there is only one "correct" readout as verified by a sufficiently strong CRC function, this search can run through all of the pairwise combinations until the "correct" readout is identified.

In another embodiment, the present disclosure provides a second strategy for identification of more than one error to save a sufficient number of reserve columns to use the full data word plus all of the reserve words to perform an error correction based on a conventional error control coding technique, for example BCH coding.

Accordingly, in another embodiment the data recovery process in accordance with the present disclosure provides another technique for detecting and correcting an error within single word of memory. The challenge of a single word of memory versus a block of data is the corrected word can no longer be validated with a checksum or CRC function across the entire block. The "correctness" of the corrected word is contained within that word.

This can be approached by recognizing that the "correct" readout is contained in the table lookup, and the errant readout is not, given that the number of errors is small. When an error is detected, the reserve column can be again be swapped in for each candidate error column until there is a correct readout. A well-chosen table make this possible.

2.2 Memory Readout Efficiency

In another embodiment, the data recovery process according to the present disclosure provides error control coding of digital information implemented with the application of OCTS table-driven encoding and decoding of digital information, and implemented using direct table readout for both encode and decode processes.

This process also provides the opportunity for improved efficiency of detecting and decoding the information read out. The baseline process for detection and decoding is to read the sample values using a with an analog to digital converter, and searching the OCTS table for the encoded vector closest to the digitized sample vector as measured in Euclidian space.

Figure 7:
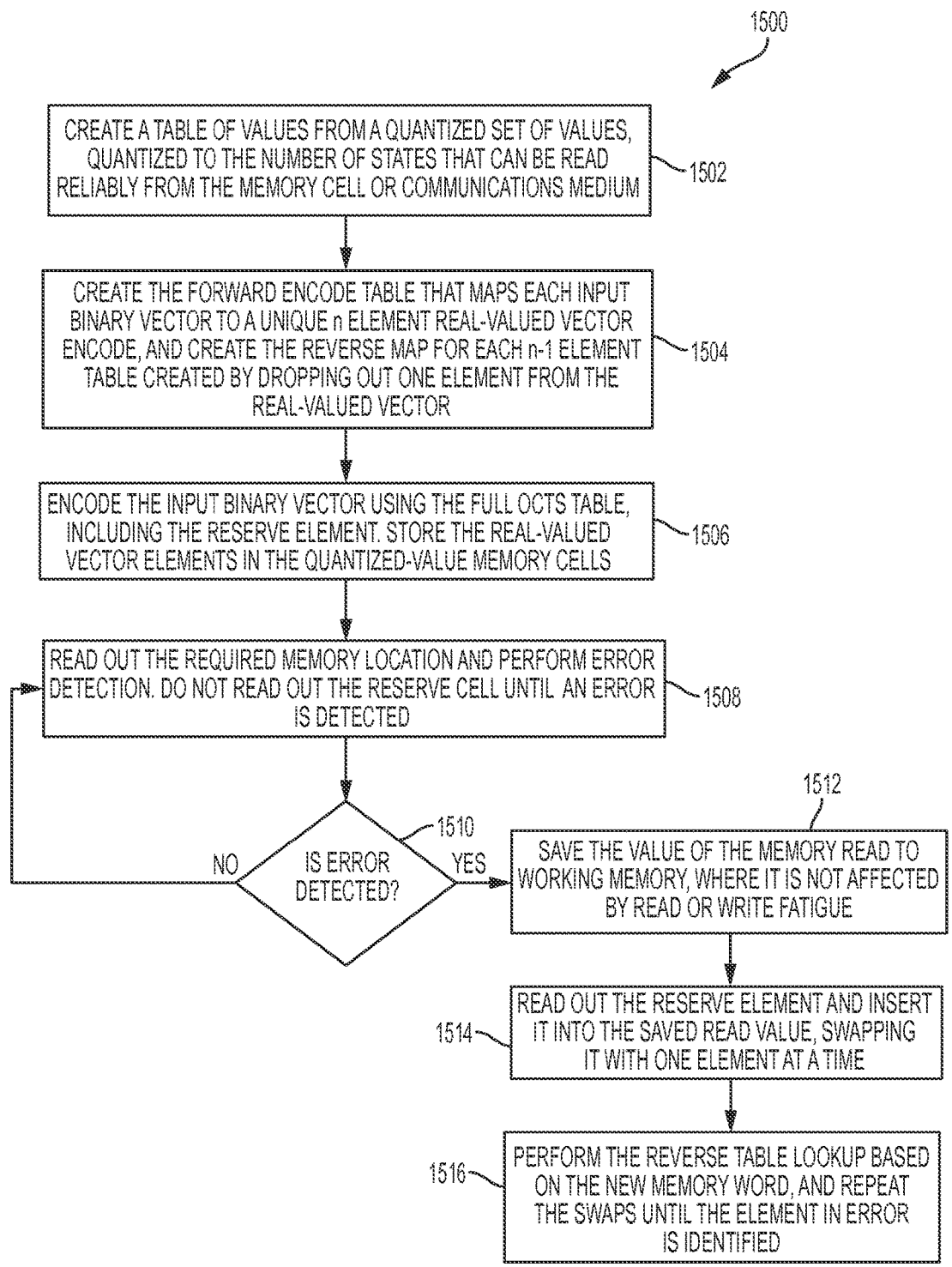
FIG. 7 illustrates one embodiment of a data recovery process with memory readout efficiency.
Figure 8:
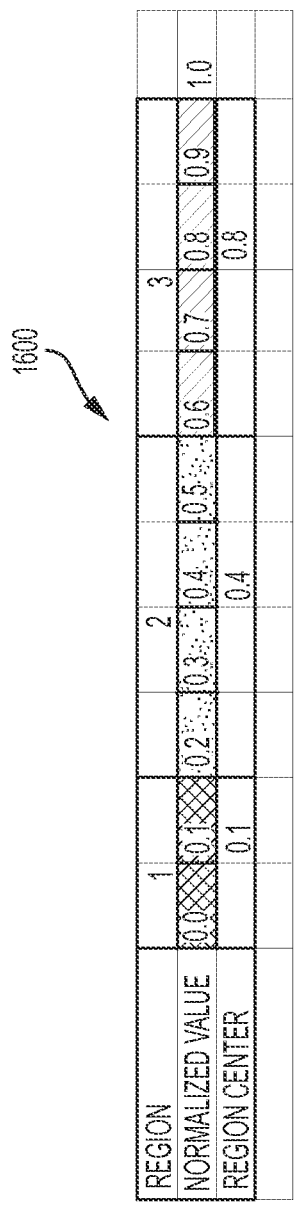
FIG. 8 illustrates one embodiment of a quantization schedule.

FIG. 7 illustrates one embodiment of a data recovery process 1500 with memory readout efficiency. The encoding and decoding process will now be described in accordance with the data recovery process 1500 with memory readout efficiency. Accordingly, in accordance with the data recovery process 1500, a table of values is created 1502 from a quantized set of values, quantized to the number of states that can be read reliably from the memory cell or communications medium. For instance, a cell coded to hold a single bit requires two quantized value, and cell coded to hold two bits requires four quantized values. To illustrate this example and as a lead to a following section, consider quantizing to three values as illustrated in FIG. 8, which shows an example quantization schedule 1600 where the cell values have been normalized to the range [0.0, 1.0]. The quantized values are (0.1, 0.4, 0.8) and the detection process can be implemented by identifying the region that a received value falls in.

For maximum efficiency and simplicity of the decode process, the OCTS table can be created with n elements such that a correct decode of n−1 elements maps exactly and only to a single value. With reference back to FIG. 7, the forward encode table that maps each input binary vector to a unique n element real-valued vector encode is created 1504, and the reverse map for each n−1 element table created by dropping out one element from the real-valued vector is created. The reverse map will convert a detected quantized vector back to its original binary-valued vector. The input binary vector is encoded 1506 using the full OCTS table, including the reserve element. The real-valued vector elements are stored in the quantized-value memory cells. The required memory location is read out 1508 and error detection is performed. The reserve cell is not read out until an error is detected 1510. In the case of flash memory, the error mechanisms include read fatigue and write fatigue. By using the reserve element only when an error is detected 1510, the errors caused by read fatigue and write fatigue are reduced. If an error is detected 1510, the value of the memory read is saved 1512 to working memory, where it is not affected by read or write fatigue. The reserve element is then read out 1514 and inserted into the saved read value, and it is swapped with one element at a time. A reverse table lookup is performed 1516 based on the new memory word, and the swaps are repeated until the element in error is identified.

This process provides the additional benefits of simplifying and reducing the energy requirements for error correction and controller management. The decode process is a table lookup rather than a calculation, saving the processing required for calculation at the expense of creating additional reverse lookup table, one for each lookup with an original vector element missing and replaced by the reserve element. The management of cells that fatigue can be implemented by using the reserve element to help identify a cell that is fatiguing, and modifying the OCTS table or the quantization regions to compensate for the fatigued cell. The management of cells that completely fail can be implemented by using a mapping function to swap access from the failed cell to the reserve element, and to a new cell to serve as the reserve element.

2.3 Fractional Bit Encoding

In another embodiment, the data recovery process according to the present disclosure provides an application of OCTS table encoding of a digital element techniques to a number of quanta other than a power of 2. For instance, encoding a digital element to one of five quanta rather than one of four.

2.3.a Data Storage and Recovery Implemented in Galois Fields of Characteristic≠2

As previously described, the number of quantized steps encoded in a cell does not need to be a power of 2. In one embodiment, the OCTS table can be effectively characterized as a table in a base equal to the number of quantized steps included in a cell. This technique provides the advantage of enabling an arbitrary number of levels encoded into a memory cell, as opposed to $2^n$, where n is the number of bits encoded per cell. For instance, in the transition between two bits per cell to three bits per cell, the number of levels encoded within a cell increases from four to eight. This process provides the opportunity to encode to 5, 6, or 7 levels, opening opportunities for incremental improvement not available with the conventional base 2 model.

This use of a base characteristic #2 for generating Galois Fields opens up the domain of Hamming distance-based algorithms built using characteristic polynomials in bases other than 2 to generate the error correcting codes. This provides the benefits of well-established algorithms implemented in seldom used bases, and increasing the capacity of memory in incremental steps as discussed above.

2.4 Channel Sensing, Optimization, and Control

In another embodiment, the data recovery process according to the present disclosure provides the use of OCTS table-derived measures to drive controller memory channel quantization levels to improve memory cell performance, and to drive channel management decisions. With the cell in error identified, initiate the process to characterize the error. Detect a fatigued cell by comparing its analog readout value to the established thresholds for the value it was corrected to. If this is close to a threshold, the threshold may be moved to reflect the fatigue. If the errant cell readout is not close to its prescribed threshold, the process may consider it to be locked up or floating, and the process may consider removing that column from service and bring in a new column from the reserved set of columns.

2.5 Multiple Secure Memory Partitions Using OCTS Tools

In another embodiment, the data recovery process according to the present disclosure provides inclusion of an OCTS Gateway Table and OCTS Composite Table to enable secure memory partitions. Accordingly, the OCTS Gateway Table and multiple Composite Tables can be used to provide encoded access to protected blocks of memory. For instance, this can provide protected access for proprietary operating system drivers. A single memory partition can be protected with the combination of a unique Gateway Channel table and a unique Composite Channel table. A set of memory partitions can be protected with a unique Gateway Channel table and a set of Composite Channel tables.

Figure 9:
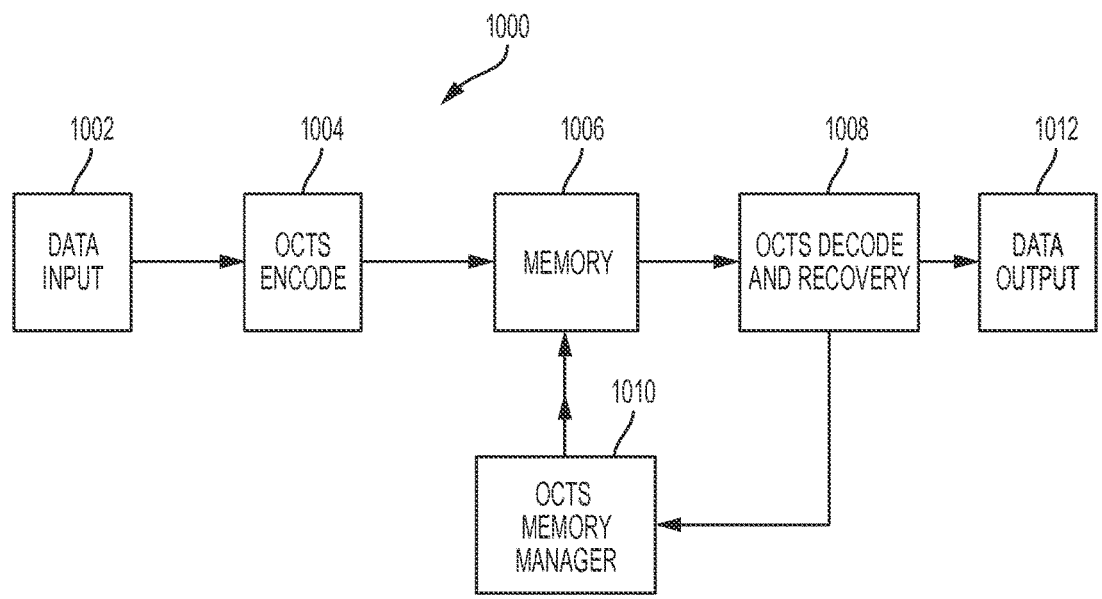
FIG. 9 illustrates one embodiment of a system for storing binary data.

FIG. 9 illustrates one embodiment of a system 1000 for storing binary data. The system 1000 comprises a processor and a digital data storage device or system coupled to the processor and a non-transitory memory medium operatively coupled to the processor, wherein the memory medium is configured to store a plurality of instructions configured to program the processor to. A binary data input stream or vector 1002 is received by an OCTS encoder 1004. The OCTS encoder 1004 transforms the digital bit stream 1002 to an encoded digital bit stream, wherein the encoded digital bit stream encoded by an OCTS-expanded table for storage. The OCTS encoder 1004 encodes the data input stream 1002 into an array of data for storage in the memory 1006. An external OCTS control, as shown in FIG. 4A, directs the OCTS encoder 1004 to store the encoded array of data in a memory 1006. The OCTS encoder 1004 may add fields to the array of data to enable an OCTS decoder 1008 to detect degradation in the array of data stored in the memory 1006. The OCTS decoder 1008 detects errors and changes in the array of data stored in the memory 1006 and provides feedback to an OCTS memory manager 1010. The OCTS memory manager 1010 reconfigures the memory 1006 when data errors are detected by the OCTS decoder 1008. The OCTS decoder 1008 pushes the data out as a binary data output stream 1012 when the degraded data is recovered.

In one embodiment, the OCTS encoder 1004 is configured to store the encoded digital bit stream by encoding the encoded digital bit stream with a lookup table. In another embodiment, the OCTS decoder 1008 is configured to retrieve the encoded digital bit stream by decoding the data stored in the memory 1006 with the lookup table, and calculate a Hamming distance to assure data recovery in the presence of a degraded storage device or system. The OCTS decoder 1008 is configured to select additional monitoring when the Hamming distance shows an increasing trend as the data stored in the memory 1006 is retrieved. In one embodiment, The OCTS memory manager 1010 is configured to manage data storage performance tasks to expand the utility of OCTS as an industry-standards agnostic interface to an existing digital data storage device or system. In one embodiment, configured to characterize the memory 1006 storage device or system for the purpose of optimizing storage and avoiding inoperative areas of the storage device or system.

Figure 10:
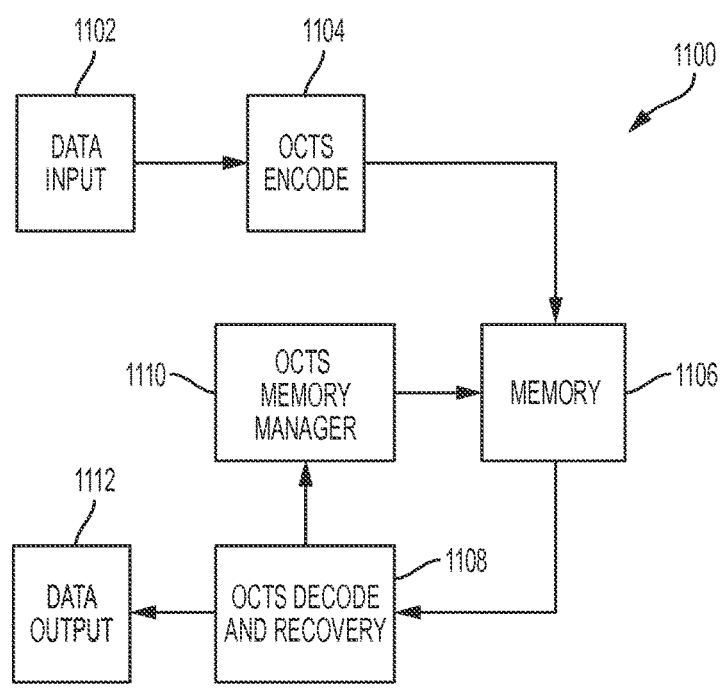
FIG. 10 illustrates another embodiment of a system for storing binary data.

FIG. 10 illustrates another embodiment of a system 1100 for storing binary data. The system 1100 comprises a processor and a digital data storage device or system coupled to the processor and a non-transitory memory medium operatively coupled to the processor, wherein the memory medium is configured to store a plurality of instructions configured to program the processor to. A binary data input stream or vector 1102 is received by an OCTS encoder 1104. The OCTS encoder 1104 transforms the digital bit stream 1102 to an encoded digital bit stream, wherein the encoded digital bit stream encoded by an OCTS-expanded table for storage. The OCTS encoder 1104 encodes the data input stream 1102 into an array of data for storage in the memory 1106. An external OCTS control, as shown in FIG. 4A, directs the OCTS encoder 1104 to store the encoded array of data in a memory 1106. The OCTS encoder 1104 may add fields to the array of data to enable an OCTS decoder 1108 to detect degradation in the array of data stored in the memory 1106. The OCTS decoder 1108 detects errors and changes in the array of data stored in the memory 1106 and provides feedback to an OCTS memory manager 1110. The OCTS memory manager 1110 reconfigures the memory 1106 when data errors are detected by the OCTS decoder 1108. The OCTS decoder 1108 pushes the data out as a binary data output stream 1112 when the degraded data is recovered.

In one embodiment, the OCTS encoder 1104 is configured to store the encoded digital bit stream by encoding the encoded digital bit stream with a lookup table. In another embodiment, the OCTS decoder 1108 is configured to retrieve the encoded digital bit stream by decoding the data stored in the memory 1106 with the lookup table, and calculate a Hamming distance to assure data recovery in the presence of a degraded storage device or system. The OCTS decoder 1108 is configured to select additional monitoring when the Hamming distance shows an increasing trend as the data stored in the memory 1106 is retrieved. In one embodiment, The OCTS memory manager 1110 is configured to manage data storage performance tasks to expand the utility of OCTS as an industry-standards agnostic interface to an existing digital data storage device or system. In one embodiment, configured to characterize the memory 1106 storage device or system for the purpose of optimizing storage and avoiding inoperative areas of the storage device or system.

3. Summary

In some embodiments, OCTS-expanded for data storage provides optimized data storage and recovery independent of industry and regulatory standards for input digital bit streams and transmission methods. Existing digital storage systems and existing data transfer standards may be employed. OCTS-expanded for data storage uses an OCTS-expanded Composite Message, where the additional information is identical in form and function to already established systems and standards.

Figure 11:
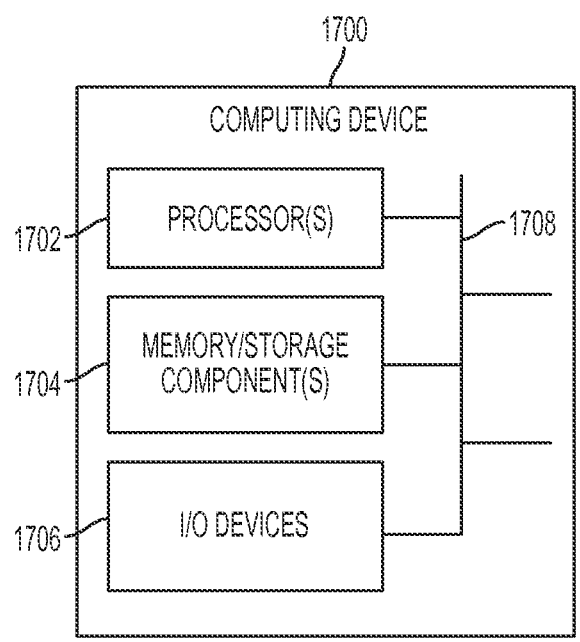
FIG. 11 illustrates one embodiment of a computing device which can be used in one embodiment of the systems and methods for data recovery utilizing optimized code table signaling.

FIG. 11 illustrates one embodiment of a computing device 1700 which can be used in one embodiment of the systems and methods for data recovery utilizing optimized code table signaling. In this example, the computing device 1700 comprises one or more processor circuits or processing units 1702, on or more memory circuits and/or storage circuit component(s) 1704 and one or more input/output (I/O) circuit devices 1706. Additionally, the computing device 1700 comprises a bus 1708 that allows the various circuit components and devices to communicate with one another. The bus 1708 represents one or more of any of several types of bus structures, including a memory bus or local bus using any of a variety of bus architectures. The bus 1708 may comprise wired and/or wireless buses.

The processing unit 1702 may be implemented as a host central processing unit (CPU) using any suitable processor circuit or logic device (circuit), such as a as a general purpose processor. The processing unit 1702 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

As shown, the processing unit 1702 may be coupled to the memory and/or storage component(s) 1704 through the bus 1708. The memory bus 1708 may comprise any suitable interface and/or bus architecture for allowing the processing unit 1702 to access the memory and/or storage component(s) 1704. Although the memory and/or storage component(s) 1704 may be shown as being separate from the processing unit 1702 for purposes of illustration, it is worthy to note that in various embodiments some portion or the entire memory and/or storage component(s) 1704 may be included on the same integrated circuit as the processing unit 1702. Alternatively, some portion or the entire memory and/or storage component(s) 1704 may be implemented in an integrated circuit or other medium (e.g., hard disk drive) external to the integrated circuit of the processing unit 1702. In various embodiments, the computing device 1700 may comprise an expansion slot to support a multimedia and/or memory card, for example.

The memory and/or storage component(s) 1704 represent one or more computer-readable media. The memory and/or storage component(s) 1704 may be implemented using any computer-readable media capable of storing data such as volatile or non-volatile memory, removable or non-removable memory, erasable or non-erasable memory, writeable or re-writeable memory, and so forth. The memory and/or storage component(s) 1704 may comprise volatile media (e.g., random access memory (RAM)) and/or nonvolatile media (e.g., read only memory (ROM), Flash memory, optical disks, magnetic disks and the like). The memory and/or storage component(s) 1704 may comprise fixed media (e.g., RAM, ROM, a fixed hard drive, etc.) as well as removable media (e.g., a Flash memory drive, a removable hard drive, an optical disk, etc.). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

The one or more I/O devices 1706 allow a user to enter commands and information to the computing device 1700, and also allow information to be presented to the user and/or other components or devices. Examples of input devices include a keyboard, a cursor control device (e.g., a mouse), a microphone, a scanner and the like. Examples of output devices include a display device (e.g., a monitor or projector, speakers, a printer, a network card, etc.). The computing device 1700 may comprise an alphanumeric keypad coupled to the processing unit 1702. The keypad may comprise, for example, a QWERTY key layout and an integrated number dial pad. The computing device 900 may comprise a display coupled to the processing unit 1702. The display may comprise any suitable visual interface for displaying content to a user of the computing device 1700. In one embodiment, for example, the display may be implemented by a liquid crystal display (LCD) such as a touch-sensitive color (e.g., 76-bit color) thin-film transistor (TFT) LCD screen. The touch-sensitive LCD may be used with a stylus and/or a handwriting recognizer program.

The processing unit 1702 may be arranged to provide processing or computing resources to the computing device 1700. For example, the processing unit 1702 may be responsible for executing various software programs including system programs such as operating system (OS) and application programs. System programs generally may assist in the running of the computing device 1700 and may be directly responsible for controlling, integrating, and managing the individual hardware components of the computer system. The OS may be implemented, for example, as a Microsoft® Windows OS, Symbian OS™, Embedix OS, Linux OS, Binary Run-time Environment for Wireless (BREW) OS, JavaOS, Android OS, Apple OS or other suitable OS in accordance with the described embodiments. The computing device 1700 may comprise other system programs such as device drivers, programming tools, utility programs, software libraries, application programming interfaces (APIs), and so forth.

Various embodiments may be described herein in the general context of computer executable instructions, such as software, program modules, and/or engines being executed by a computer. Generally, software, program modules, and/or engines include any software element arranged to perform particular operations or implement particular abstract data types. Software, program modules, and/or engines can include routines, programs, objects, components, data structures and the like that perform particular tasks or implement particular abstract data types. An implementation of the software, program modules, and/or engines components and techniques may be stored on and/or transmitted across some form of computer-readable media. In this regard, computer-readable media can be any available medium or media useable to store information and accessible by a computing device. Some embodiments also may be practiced in distributed computing environments where operations are performed by one or more remote processing devices that are linked through a communications network. In a distributed computing environment, software, program modules, and/or engines may be located in both local and remote computer storage media including memory storage devices.

Although some embodiments may be illustrated and described as comprising functional components, software, engines, and/or modules performing various operations, it can be appreciated that such components or modules may be implemented by one or more hardware components, software components, and/or combination thereof. The functional components, software, engines, and/or modules may be implemented, for example, by logic (e.g., instructions, data, and/or code) to be executed by a logic device (e.g., processor). Such logic may be stored internally or externally to a logic device on one or more types of computer-readable storage media. In other embodiments, the functional components such as software, engines, and/or modules may be implemented by hardware elements that may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Examples of software, engines, and/or modules may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

In some cases, various embodiments may be implemented as an article of manufacture. The article of manufacture may include a computer readable storage medium arranged to store logic, instructions and/or data for performing various operations of one or more embodiments. In various embodiments, for example, the article of manufacture may comprise a magnetic disk, optical disk, flash memory or firmware containing computer program instructions suitable for execution by a general purpose processor or application specific processor. The embodiments, however, are not limited in this context.

Reference throughout the specification to "various embodiments," "some embodiments," "one embodiment," "an embodiment", "one aspect," "an aspect" or the like, means that a particular feature, structure, or characteristic described in connection with the embodiment is included in at least one embodiment. Thus, appearances of the phrases "in various embodiments," "in some embodiments," "in one embodiment", or "in an embodiment", or the like, in places throughout the specification are not necessarily all referring to the same embodiment. Furthermore, the particular features, structures or characteristics may be combined in any suitable manner in one or more aspects. Furthermore, the particular features, structures, or characteristics may be combined in any suitable manner in one or more embodiments. Thus, the particular features, structures, or characteristics illustrated or described in connection with one embodiment may be combined, in whole or in part, with the features structures, or characteristics of one or more other embodiments without limitation. Such modifications and variations are intended to be included within the scope of the present invention.

While various details have been set forth in the foregoing description, it will be appreciated that the various aspects of the OCTS-expanded for data storage may be practiced without these specific details. For example, for conciseness and clarity selected aspects have been shown in block diagram form rather than in detail. Some portions of the detailed descriptions provided herein may be presented in terms of instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities.

Unless specifically stated otherwise as apparent from the foregoing discussion, it is appreciated that, throughout the foregoing description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The following claims are intended to cover all such modification and variations.

Some or all of the embodiments described herein may generally comprise technologies for various aspects of the OCTS-expanded for data storage, or otherwise according to technologies described herein. In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. Those skilled in the art will recognize, however, that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

Some aspects may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other, but yet still co-operate or interact with each other.

In some instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory).

A sale of a system or method may likewise occur in a territory even if components of the system or method are located and/or used outside the territory. Further, implementation of at least part of a system for performing a method in one territory does not preclude use of the system in another territory.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The following claims are intended to cover all such modification and variations.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated. It is intended that the claims submitted herewith define the overall scope.

Various aspects of the subject matter described herein are set out in the following examples:

1. In one example, a computer-implemented method for storing binary data is provided. The method comprises receiving, by a processor, a digital bit stream; transforming, by the processor, the digital bit stream to an encoded digital bit stream, wherein the encoded digital bit stream comprises a data message encoded by an OCTS-expanded table for storage; and storing, by the processor, the encoded digital bit stream on a digital data storage device or system.

2. The computer-implemented method of example 1, further comprising providing, by the processor, a code table for the data message, wherein the code table is partitioned for each sub-element of a combined message set.

3. The computer-implemented method of any one of the examples 1-2, further comprising choosing, by the processor, the code tables such that the bit error rate, hardware error rates, software and/or firmware error rates, or data transfer rates are managed dynamically to provide optimized performance.

4. The computer-implemented method of any one of examples 1-3, further comprising storing, by the processor, the digital bit stream as transformed to the encoded digital bit stream with a lookup table.

5. The computer-implemented method of any one of examples 1-4, further comprising retrieving, by the processor, the encoded digital bit stream by decoding the stored encoded digital bit stream with the lookup table, and calculating, by the processor, a Hamming distance to assure data recovery in the presence of a degraded storage device or degraded system.

6. The computer-implemented method of any one of examples 1-5, further comprising identifying, by the processor, storage cells for additional analysis when the Hamming distance shows an increasing trend as stored data is retrieved.

7. The computer-implemented method of any one of examples 1-6, further comprising selecting, by the processor, additional monitoring when the Hamming distance shows an increasing trend as stored data is retrieved.

8. The computer-implemented method of any one of examples 1-7, further comprising modifying, by the processor, a code table when the Hamming distance shows an increasing trend as stored data is retrieved.

9. The computer-implemented method of any one of examples 1-8, further comprising managing, by the processor, data storage performance tasks to expand a utility of OCTS as an industry-standards agnostic interface to an existing digital data storage device or system.

10. The computer-implemented method of any one of examples 1-9, further comprising including, by the processor, an error correcting code as additional data vectors that are uniquely added to the encoded digital bit stream.

11. The computer-implemented method of any one of examples 1-10, further comprising characterizing, by the processor, a storage device or system for the purpose of optimizing storage and avoiding inoperative areas of the storage device or system.

12. In another example, a system is provided. The system comprises a processor, a digital data storage device or system coupled to the processor; and a non-transitory memory medium operatively coupled to the processor, wherein the memory medium is configured to store a plurality of instructions configured to program the processor to: receive, a digital bit stream; transform the digital bit stream to an encoded digital bit stream, wherein the encoded digital bit stream is encoded by an OCTS-expanded table for storage; and store the encoded digital bit stream on a digital data storage device or system.

13. The system of example 12, wherein the processor is further configured to store the encoded digital bit stream by encoding the encoded digital bit stream with a lookup table.

14. The system of any one of examples 12-13, wherein the processor is further configured to retrieve the encoded digital bit stream by decoding the stored encoded digital bit stream with a lookup table, and calculate a Hamming distance to assure data recovery in the presence of a degraded storage device or degraded system.

15. The system of any one of examples 12-14, wherein the processor is further configured to select additional monitoring when the Hamming distance shows an increasing trend as stored data is retrieved.

16. The system of any one of examples 12-15, wherein the processor is further configured to manage data storage performance tasks to expand a utility of OCTS as an industry-standards agnostic interface to an existing digital data storage device or system.

17. The system of any one of examples 12-16, wherein the processor is further configured to characterize the storage device or system for the purpose of optimizing storage and avoiding inoperative areas of the digital data storage device or system.

18. In another example, a non-transitory computer-readable memory medium is provided. The non-transitory computer-readable memory medium is configured to store instructions thereon that when loaded by a processor causes the processor to: receive a digital bit stream; transform the digital bit stream to an encoded digital bit stream, wherein the encoded digital bit stream comprises a data message encoded by an OCTS-expanded table for storage; and store the encoded digital bit stream on a digital data storage device or system.

19. In another example, a computer-implemented method for storing binary data is provided. The method comprises receiving, by a processor, a digital bit stream; transforming, by the processor, the digital bit stream to a multi-valued, quantized data stream, wherein the multi-valued quantized data stream comprises a data message encoded by an OCTS-expanded table for storage; and storing, by the processor, the multi-valued quantized data stream on a multi-level memory storage device or system.

20. The computer-implemented method of example 19, further comprising providing, by the processor, a code table for the data message.

21. The computer-implemented method of any one of examples 19-20, further comprising choosing, by the processor, a code table such that the bit error rate, hardware error rates, software and/or firmware error rates, or data transfer rates are managed dynamically to provide optimized performance.

22. The computer-implemented method of any one of examples 19-21, further comprising storing, by the processor, the digital bit stream transformed to the multi-valued quantized data stream with a lookup table.

23. The computer-implemented method of any one of examples 19-22, further comprising retrieving, by the processor, the multi-valued encoded quantized data stream by decoding the stored multi-valued encoded quantized data stream with the lookup table, and calculating, by the processor, a mean free Euclidean distance to assure data recovery in the presence of a degraded storage device or degraded system.

24. The computer-implemented method of any one of examples 19-23 further comprising identifying, by the processor, storage cells for additional analysis when the mean free Euclidean distance shows an increasing trend as stored data is retrieved.

25. The computer-implemented method of any one of examples 19-24, further comprising selecting, by the processor, additional monitoring when the mean free Euclidean distance shows an increasing trend as stored data is retrieved.

26. The computer-implemented method of any one of examples 19-25, further comprising modifying, by the processor, a code table when the mean free Euclidean distance shows an increasing trend as stored data is retrieved.

27. The computer-implemented method of any one of examples 19-26, further comprising managing, by the processor, data storage performance tasks to expand a utility of OCTS as an industry-standards agnostic interface to an existing multi-level memory storage device or system.

28. The computer-implemented method of any one of examples 19-27, further comprising including, by the processor, an error correcting code as additional data vectors that are uniquely added to the encoded data stream.

29. The computer-implemented method of any one of examples 19-28, further comprising characterizing, by the processor, a storage device or system for the purpose of optimizing storage and avoiding inoperative areas of the multi-level memory storage device or system.

30. In another example, a system is provided. The system comprises a processor, a multi-level memory storage device or system coupled to the process; and a non-transitory memory medium operatively coupled to the processor, wherein the memory medium is configured to store a plurality of instructions configured to program the processor to: receive a digital bit stream; transform the digital bit stream to a multi-valued quantized data stream, wherein the multi-valued quantized data stream comprises a data message encoded by an OCTS-expanded table for storage; and store the multi-valued quantized data stream on a multi-level memory storage device or system.

31. The system of example 30, wherein each message comprises a code table, wherein the processor is configured to select code tables such that the bit error rate, hardware error rates, software and/or firmware error rates, or data transfer rates are managed dynamically to provide optimized performance.

32. The system of any one of examples 30-31, wherein the processor is further configured to mask the multi-valued quantized data stream and the encoded data message.

33. The system of any one of examples 30-32, wherein the processor is further configured to stored the multi-valued quantized data stream by encoding the multi-valued quantized data stream with a lookup table.

34. The system of any one of examples 30-33, wherein the processor is further configured to retrieve, the multi-valued quantized data stream by decoding the stored data with the lookup table, and calculate a mean free Euclidean distance to assure data recovery in the presence of a degraded storage device or system.

35. The system of any one of examples 30-34, wherein the processor is further configured to select additional monitoring when the mean free Euclidean distance shows an increasing trend as stored data is retrieved.

36. The system of any one of examples 30-35, wherein the processor is further configured to manage data storage performance tasks to expand a utility of OCTS as an industry-standards agnostic interface to an existing multi-level memory storage device or system.

37. The system of any one of examples 30-36, wherein the processor is further configured to characterize the multi-level memory storage device or system for the purpose of optimizing storage and avoiding inoperative areas of the multi-level memory storage device or system.

38. In another example, a non-transitory computer-readable memory medium is provided. The non-transitory computer-readable medium is configured to store instructions thereon that when loaded by a processor causes the processor to: receive, a digital bit stream; transform the digital bit stream to a multi-valued quantized data stream, wherein the quantized data stream comprises a data message encoded by an OCTS-expanded table for storage; and store, the quantized data stream, on a multi-level memory storage device or system.

What is claimed is:

1. A computer-implemented method for storing binary data, the method comprising:
　receiving, by a processor, a digital bit stream;
　transforming, by the processor, the digital bit stream to an encoded digital bit stream, wherein the encoded digital bit stream comprises a data message encoded by an OCTS-expanded table;
　storing, by the processor, the encoded digital bit stream on a digital data storage device or system;
　retrieving, by the processor, the encoded digital bit stream by decoding the stored encoded digital bit stream with the OCTS-expanded table; and
　calculating, by the processor, a Hamming distance to assure data recovery.

2. The computer-implemented method of claim 1, further comprising identifying, by the processor, storage cells for additional analysis when the Hamming distance shows an increasing trend as stored data is retrieved.

3. The computer-implemented method of claim 1, further comprising selecting, by the processor, additional monitoring when the Hamming distance shows an increasing trend as stored data is retrieved.

4. The computer-implemented method of claim 1, further comprising modifying, by the processor, a code table when the Hamming distance shows an increasing trend as stored data is retrieved.

5. The computer-implemented method of claim 1, further comprising managing, by the processor, data storage performance tasks to expand a utility of OCTS as an industry-standards agnostic interface to an existing digital data storage device or system.

6. The computer-implemented method of claim 1, further comprising including, by the processor, an error correcting code as additional data vectors that are uniquely added to the encoded digital bit stream.

7. The computer-implemented method of claim 1, further comprising characterizing, by the processor, a storage device or system for the purpose of optimizing storage and avoiding inoperative areas of the storage device or system.

8. A system comprising:
　a processor, a digital data storage device or system coupled to the processor; and a non-transitory memory medium operatively coupled to the processor, wherein the memory medium is configured to store a plurality of instructions configured to program the processor to:

receive a digital bit stream;

transform the digital bit stream to an encoded digital bit stream, wherein the encoded digital bit stream is encoded by an OCTS-expanded table;

store the encoded digital bit stream on a digital data storage device or system;

retrieve the encoded digital bit stream by decoding the stored encoded digital bit stream with the OCTS-expanded table; and calculate a Hamming distance to assure data recovery.

9. The system of claim 8, wherein the processor is further configured to select additional monitoring when the Hamming distance shows an increasing trend as stored data is retrieved.

10. The system of claim 8, wherein the processor is further configured to manage data storage performance tasks to expand a utility of OCTS as an industry-standards agnostic interface to an existing digital data storage device or system.

11. The system of claim 8, wherein the processor is further configured to characterize the storage device or system for the purpose of optimizing storage and avoiding inoperative areas of the digital data storage device or system.

12. A computer-implemented method for storing binary data, comprising:

receiving, by a processor, a digital bit stream;

transforming, by the processor, the digital bit stream to a multi-valued, quantized data stream, wherein the multi-valued quantized data stream comprises a data message encoded by an OCTS-expanded table;

storing, by the processor, the multi-valued quantized data stream on a multi-level memory storage device or system;

retrieving, by the processor, the digital bit stream by decoding the stored multi-valued quantized digital bit stream with the OCTS-expanded table; and calculating, by the processor, a mean free Euclidean distance to assure data recovery.

13. The computer-implemented method of claim 12, further comprising identifying, by the processor, storage cells for additional analysis when the mean free Euclidean distance shows an increasing trend as stored data is retrieved.

14. The computer-implemented method of claim 12, further comprising selecting, by the processor, additional monitoring when the mean free Euclidean distance shows an increasing trend as data is retrieved.

15. The computer-implemented method of claim 12, further comprising modifying, by the processor, a code table when the mean free Euclidean distance shows an increasing trend as data is retrieved.

16. The computer-implemented method of claim 12, further comprising managing, by the processor, data storage performance tasks to expand a utility of OCTS as an industry-standards agnostic interface to an existing multi-level memory storage device or system.

17. The computer-implemented method of claim 12, further comprising including, by the processor, an error correcting code as additional data vectors that are uniquely added to the quantized data stream.

18. The computer-implemented method of claim 12, further comprising characterizing, by the processor, a storage device or system for the purpose of optimizing storage and avoiding inoperative areas of the multi-level memory storage device or system.

19. A system comprising:

a processor, a multi-level memory storage device or system coupled to the process; and a non-transitory memory medium operatively coupled to the processor, wherein the memory medium is configured to store a plurality of instructions configured to program the processor to:

receive a digital bit stream;

transform the digital bit stream to a multi-valued quantized data stream, wherein the multi-valued quantized data stream comprises a data message encoded by an OCTS-expanded table;

store the multi-valued quantized data stream on a multi-level memory storage device or system;

retrieve the multi-valued quantized data stream by decoding the stored data with the OCTS-expanded table; and calculate a mean free Euclidean distance to assure data recovery.

20. The system of claim 19, wherein the processor is configured to select the OCTS-expanded table such that a bit error rate, hardware error rates, software and/or firmware error rates, or data transfer rates are managed dynamically.

21. The system of claim 19, wherein the processor is further configured to mask the multi-valued quantized data stream.

22. The system of claim 19, wherein the processor is further configured to store the multi-valued quantized data stream by encoding the multi-valued quantized data stream with a lookup table.

23. The system of claim 19, wherein the processor is further configured to select additional monitoring when the mean free Euclidean distance shows an increasing trend as stored data is retrieved.

24. The system of claim 19, wherein the processor is further configured to manage data storage performance tasks to expand a utility of OCTS as an industry-standards agnostic interface to an existing multi-level memory storage device or system.

25. The system of claim 19, wherein the processor is further configured to characterize the multi-level memory storage device or system for the purpose of optimizing storage and avoiding inoperative areas of the multi-level memory storage device or system.

* * * * *